(12) United States Patent
Hoffmann et al.

(10) Patent No.: US 9,054,310 B2
(45) Date of Patent: Jun. 9, 2015

(54) CERAMIC MATERIAL BASED ON THE PEROVSKITE CERAMIC BI0, 5NA0, 5TIO3, PIEZOELECTRIC ACTUATOR CONTAINING THE CERAMIC MATERIAL AND PROCESS FOR PRODUCING THE CERAMIC MATERIAL

(75) Inventors: Christian Hoffmann, Artemisu Kozu (JP); Yongli Wang, Frauental (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 13/823,105

(22) PCT Filed: Sep. 16, 2011

(86) PCT No.: PCT/EP2011/066138
§ 371 (c)(1),
(2), (4) Date: May 17, 2013

(87) PCT Pub. No.: WO2012/035151
PCT Pub. Date: Mar. 22, 2012

(65) Prior Publication Data
US 2013/0228715 A1    Sep. 5, 2013

(30) Foreign Application Priority Data

Sep. 16, 2010  (DE) .......................... 10 2010 045 597

(51) Int. Cl.
*C04B 35/00*   (2006.01)
*H01L 41/187*  (2006.01)
(Continued)

(52) U.S. Cl.
CPC .......... *H01L 41/1878* (2013.01); *C04B 35/462* (2013.01); *C04B 35/475* (2013.01);
(Continued)

(58) Field of Classification Search
CPC .... C04B 35/453; C04B 35/462; C04B 35/50; C04B 2235/3236; C04B 2235/3244; C04B 2235/768; H01L 41/083; H01L 41/35; H01L 41/37; H01L 41/43

USPC ........... 252/62.9 PZ; 501/134–139; 310/311, 310/323.11, 358; 264/434, 681, 656, 660, 264/661
See application file for complete search history.

(56) References Cited

U.S. PATENT DOCUMENTS 6,231,779 B1    5/2001  Chiang et al.
2002/0036282 A1 *  3/2002  Chiang et al. ............ 252/62.9 R
(Continued)

FOREIGN PATENT DOCUMENTS

CN         1541976 A  * 11/2004
DE    10 2009 029 511 A1    4/2011
(Continued)

OTHER PUBLICATIONS

"Thermal Decomposition Chemistry of Poly(vinyl alcohol)" by Gilman et al., 1995, American Chemical Society, ACS Symposium Series 599, pp. 161-163 and Fig. 1).*
(Continued)

*Primary Examiner* — Carol M Koslow
*Assistant Examiner* — Lynne Edmondson
(74) *Attorney, Agent, or Firm* — McDermott Will & Emery LLP (57) ABSTRACT

A ceramic material having the general formula $(Bi_xNa_yM\langle1\rangle_zLu M\langle2\rangle_V V_w)(Ti_{1-s}Z_s)O_3$, where: $M\langle1\rangle$ comprises at least one element of main group 1, $M\langle2\rangle$ comprises at least one element of main group 2, L comprises at least one element of the lanthanides, V is a vacancy and Z is selected from among Zr, Hf and combinations thereof, is provided. Furthermore, a piezoelectric actuator comprising the ceramic material and a process for producing the ceramic material are provided.

10 Claims, 6 Drawing Sheets

(51) Int. Cl.
*C04B 35/462* (2006.01)
*C04B 35/475* (2006.01)
*C04B 35/49* (2006.01)
*C04B 35/626* (2006.01)
*C04B 35/638* (2006.01)
*H01L 41/43* (2013.01)

(52) U.S. Cl.
CPC .......... *C04B 35/49* (2013.01); *C04B 35/62655* (2013.01); *C04B 35/62675* (2013.01); *C04B 35/638* (2013.01); *C04B 2235/3201* (2013.01); *C04B 2235/3203* (2013.01); *C04B 2235/3208* (2013.01); *C04B 2235/3213* (2013.01); *C04B 2235/3215* (2013.01); *C04B 2235/3224* (2013.01); *C04B 2235/3227* (2013.01); *C04B 2235/3229* (2013.01); *C04B 2235/3232* (2013.01); *C04B 2235/3298* (2013.01); *C04B 2235/442* (2013.01); *C04B 2235/656* (2013.01); *C04B 2235/72* (2013.01); *C04B 2235/768* (2013.01); *H01L 41/1873* (2013.01); *H01L 41/43* (2013.01)

(56) References Cited

U.S. PATENT DOCUMENTS

2006/0006360 A1* 1/2006 Takao et al. ............... 252/62.9 R
2010/0323877 A1* 12/2010 Shimada et al. ............... 501/138
2011/0169123 A1* 7/2011 Katsu ........................... 257/467

FOREIGN PATENT DOCUMENTS

| EP | 1 873 130 A1 | 1/2008 |
| JP | 2002-321976 A | 11/2002 |
| JP | 2002-348173 A | 12/2002 |
| JP | 2003-026474 A | 1/2003 |
| JP | 2004-182532 A | 7/2004 |
| JP | 2005-255493 A | 9/2005 |

OTHER PUBLICATIONS

Machine translation of CN1541976A, printed Aug. 5, 2014.*
A. Herabut, et al., "Effects of Substituton in A- and B-site Cations of Bi0.5Na0.5TiO3," IEEE, 1996, pp. 775-778, Piscataway, U.S.
J. Yoo, et al., "Piezoelectric and dielectric properties of La2O3 added Bi(Na, K) TiO3-SrTiO3 ceramics for pressure sensor application," Sensors and Actuators, 2006, pp. 41-47, Elsevier B.V., Republic of Korea.
S. Danwittayakul. et al., "Influence of isovalent and aliovalent substitutions at Ti site on bismuth sodium titante-based compositions on piezoelectirc properties," Ceramics International 34, 2008, pp. 765-768, Elsevier Ltd and Techna Group S.r.I., Thailand.
Z. Xiong, "Introduction to Material Physics", Science Press, Jun. 30, 2007, pp. 233-234.

* cited by examiner

CERAMIC MATERIAL BASED ON THE PEROVSKITE CERAMIC BI0, 5NA0, 5TIO3, PIEZOELECTRIC ACTUATOR CONTAINING THE CERAMIC MATERIAL AND PROCESS FOR PRODUCING THE CERAMIC MATERIAL

A ceramic material, a piezoelectric actuator comprising the ceramic material and a process for producing the ceramic material are provided.

Lead zirconate titanates (PZT) are frequently used as ceramic materials in piezoelectric actuators.

The object of at least one embodiment of the invention is to provide an improved ceramic material which is free of lead and has improved electrical properties. This object is achieved by a ceramic material according to claim 1.

The object of at least one further embodiment is provision of a piezoelectric actuator comprising this ceramic material and a process for producing the ceramic material. These objects are achieved by the piezoelectric actuator and process according to the claims.

Further embodiments of the ceramic material and of the process for producing the ceramic material are subject matter of dependent claims.

A ceramic material having the general formula $(Bi_xNa_yM^1_zL_uM^2_vV_w)(Ti_{1-s}Z_s)O_3$ is provided. In this formula: $x+y+z+u+v+w=1$, $3x+y+z+3u+2v=2$ and x, y, z, u are each greater than 0, v is greater than or equal to 0, in particular v is greater than 0. Furthermore, $M^1$ comprises at least one element of the first main group of the Periodic Table which can be monovalent and $M^2$ comprises at least one element of the second main group of the Periodic Table which can be bivalent. L comprises at least one element of the lanthanides which can be trivalent. V is a vacancy in the lattice of the ceramic material and Z is selected from among Zr, Hf and combinations thereof.

A ceramic material based on the perovskite ceramic $Bi_{0.5}Na_{0.5}TiO_3$ which is modified by one or more elements is thus provided. The perovskite ceramic $Bi_{0.5}Na_{0.5}TiO_3$, which has the general structure $ABO_3$, is the main component in the ceramic material and forms the host lattice. The substituents $M^1$, $M^2$, L and optionally Z and vacancies V are incorporated into this lattice.

The A positions in the perovskite lattice can thus be partially occupied by the elements $M^1$, $M^2$ or L or have vacancies V, while the elements Z can be present in part of the B positions.

In one embodiment, the ceramic material $(Bi_xNa_yM^1_zL_uM^2_vV_w)(Ti_{1-s}Z_s)O_3$ is such that: $0.005 \leq z \leq 0.25$, $0.005 \leq v \leq 0.25$, $0.001 \leq u \leq 0.02$, $0 \leq w \leq 0.02$ and $0 \leq s \leq 0.2$.

Furthermore, $M^1$ can be selected from a group comprising Li and K, and $M^2$ can be selected from a group comprising Ca, Sr and Ba. $M^1$ can thus comprise an alkali metal and $M^2$ can comprise an alkaline earth metal. L can be selected from a group comprising La, Ce, Pr, Nd, Pm, Sn, Bu, Gd, Tb, Dy, Ho, Br, Tm and Yb.

In a further embodiment, the ceramic material is a lead-free ceramic material. An environmentally friendly ceramic material which is not problematic in terms of health is thus provided.

In one embodiment, the ceramic material can have the formula $Bi_{0.49}Na_{0.335}K_{0.125}Li_{0.04}Nd_{0.01}TiO_3$.

A ceramic material according to the above embodiments has a high expansion due to a nonpiezoelectric effect, namely a field-induced phase transformation.

The substituents and/or vacancies in the perovskite lattice stabilize the nonpolar phase of the ceramic material over a wide temperature range. The ceramic material is thus stable in respect of the normally reversible transformation between polar and nonpolar phase to temperature changes in a wide temperature range. In this wide temperature range, the nonpolar phase thus cannot be transformed into a polar phase by means of a temperature change. Such a transformation normally results in hysteresis and a high dielectric loss, which leads to reduced efficiency in energy transmission.

The ceramic material can have a depolarization temperature $T_d$ of <20° C. and a Curie temperature $T_c$ of >150°. The Curie temperature $T_c$ can preferably be greater than 200° C., in particular >300° C. The depolarization temperature can be, in particular, <0° C. The specific composition of the ceramic material thus enables the depolarization temperature to be set far below room temperature and the Curie temperature to be shifted to high temperatures, preferably above 300° C. Both critical temperatures are thus far outside the temperature range which is of interest in practical applications, for example the range from 20° C. to 150° C.

The electromechanical response to an electric field applied to the ceramic material is therefore independent of or only slightly dependent on the temperature, which is due to the substituents and/or vacancies leading to randomness in the lattice and diffuse phase transformations occurring, which can in turn reduce energy losses.

Cation vacancies and/or cations of different valency introduced into a ferroelectric lattice produce randomness of the field and/or the bonds due to disordered distribution of the cations having different charges. This randomness can suppress ferroelectric order over wide ranges, so that a diffuse phase transformation results. A diffuse phase transformation does not take place abruptly at a particular temperature or a particular electric field but instead gradually over a temperature or electric field range. This decreases the temperature dependence of the properties.

At the same time, dielectric hysteresis is largely suppressed and the values of the dielectric loss are largely kept low.

The phase transformation from the nonpolar state to the polar state can be achieved by application of a field strength having, for example, a value selected from the range from 1 to 6 KV/mm.

In a temperature range from 20° C. to 150° C., preferably from 20° C. to 200° C., particularly preferably from 0° C. to 280° C., the dielectric loss factor of the ceramic material can be less than 0.5, in particular less than 0.45. The expansion of the ceramic material in the temperature range from 20° C. to 150° C., preferably from 20° C. to 200° C., in particular from 0° C. to 280° C., can have a value selected from the range from 0.1% to 0.3%, for example 0.2%. In the same temperature range, the ceramic material can, on application of an electric field, have a temperature dependence of less than 30%, for example less than 20%.

The critical temperatures of the ceramic material can be set via the substituents and/or vacancies. The Curie temperature $T_c$ can, for example, be increased by Bi and/or Na in the ceramic material being replaced by cations having a smaller ionic radius, for example Ca, Li or lanthanides. On the other hand, the Curie temperature $T_c$ can be reduced when cations having a larger radius, for example Ba, Sr and K, are used.

To influence the depolarization temperature $T_d$, the substituents in the ceramic material can likewise be employed. Apart from Li and K, all substituents have a negative influence on the rhombohedral phase, i.e. a decreasing dependence of the depolarization temperature on the content of the substituents. Ba and K stabilize the tetragonal ferroelectric phase above the morphotropic phase boundary (MPB) and thus lead to a higher $T_d$ when they are present in a higher concentration. Large substituents in the B position of the ceramic material, for example Zr and Hf, and vacancies in the A position can reduce $T_d$ and widen the temperature range in which the nonpolar phase is stabilized.

The appropriate concentrations of the substituents in the ceramic material can thus be set so that the critical temperatures $T_d$ and $T_c$ are outside the temperature range which is relevant for practical applications of the ceramic material.

A ceramic material which has a controllable expansion due to a phase transformation is thus provided. High expansions of up to 0.3% can occur after excitation by means of an electric field. The electromechanical response to excitation is not or only slightly temperature-dependent, which leads to higher energy efficiency of the ceramic material.

Furthermore, in the case of a ceramic material having the above mentioned properties, it is not necessary to carry out a polarization process during its production before the material can be used for the desired application since the expansion of the material is brought about by a reversible field-induced transition from a nonpolar phase to a ferroelectric phase and piezoelectricity therefore does not have to be generated first by means of a poling process. The expansion of the material is therefore also independent of the polarity of the electric field. As a result, the production process for the ceramic material is simplified and the production costs are thus reduced and production-related defects are reduced.

The ceramic material also has unrestricted utility in respect of its polarity. For example, it can be excited by means of a unipolar or dipolar voltage or a mixture of the two types of voltage. The material thus has high flexibility in use.

Furthermore, a piezoelectric actuator which contains a ceramic material according to the above embodiments is provided. Such a piezoelectric actuator thus has improved energy efficiency combined with low production costs.

A process for producing a ceramic material according to the above embodiments is also provided. The process comprises the process steps A) mixing and milling of powdery starting materials in the stoichiometric ratio, B) drying and calcination of the mixture, C) milling of the mixture to give a ceramic powder and D) removal of binder from and sintering of the ceramic powder to give the ceramic material. The production of the ceramic material can be carried out under atmospheric pressure and at moderate temperatures. This leads to a further reduction in the production costs.

As starting materials in process step A), it is possible, for example, to select oxides and/or carbonates of $M^1$, $M^2$, L and Z; for example $Bi_2O_3$, $Nd_2O_3$, $Na_2Co_3$, $Li_2Co_3$ and $TiO_2$ can be selected. In process step B), the mixture can be dried at 60° C. and calcined at from 750 to 950° C., in particular at 800° C. Furthermore, binder removal can be carried out in process step B) at 450° C. and sintering can be carried out at from 1000 to 1150° C., in particular from 1000 to 1100° C.

Some aspects of the invention will be illustrated with the aid of the figures and the examples.

An example of an embodiment of the process for producing the ceramic material having the formula $Bi_{0.49}Nd_{0.01}Na_{0.335}K_{0.125}Li_{0.04}TiO_3$ is given.

The powdery starting materials $Bi_2O_2$, $Nd_2O_3$, $Na_2Co_3$, $K_2Co_2$, $Li_2Co_3$ and $TiO_2$ are weighed out in such amounts that they satisfy the stoichiometry of the general perovskite formula $ABO_3$. The powdery starting materials have a purity of 99.8%.

After mixing of the starting materials, they are milled in a ball mill using $ZrO_2$ balls stabilized by means of yttrium, with dehydrated ethanol being added as medium. This mixture is dried at 60° C. in an oven. The dried powder is sieved and calcined at 800° C. for four hours so as to form a homogeneous perovskite structure. The calcined powder is milled again in order to reduce the particle size. The ceramic powder obtained is dried and admixed with a polyvinyl butyral (PVB) binder and granulated.

It is subsequently pressed to form a press body having a diameter of 15.6 mm and a thickness of 1.5 mm. The green press bodies are subjected to binder removal at 450° C. for two hours and subsequently sintered at temperatures of from 1000 to 1100° C. for from one to two hours.

The two opposite surfaces of the press bodies are coated with a silver paste in order to obtain capacitors containing the ceramic material and silver electrodes. The dielectric properties are measured as a function of the temperature T and frequency v by means of an LCR bridge. The expansion S of the ceramic material is determined as a function of the electric field E and temperature T by means of an aixACCT piezoelectric evaluation system (aixACCT system GmbH). A triangular wave form and a low frequency of 0.1 Hz are used as signal. The amplitude of the field E is 4.7 kV/min.

Figure 1A:
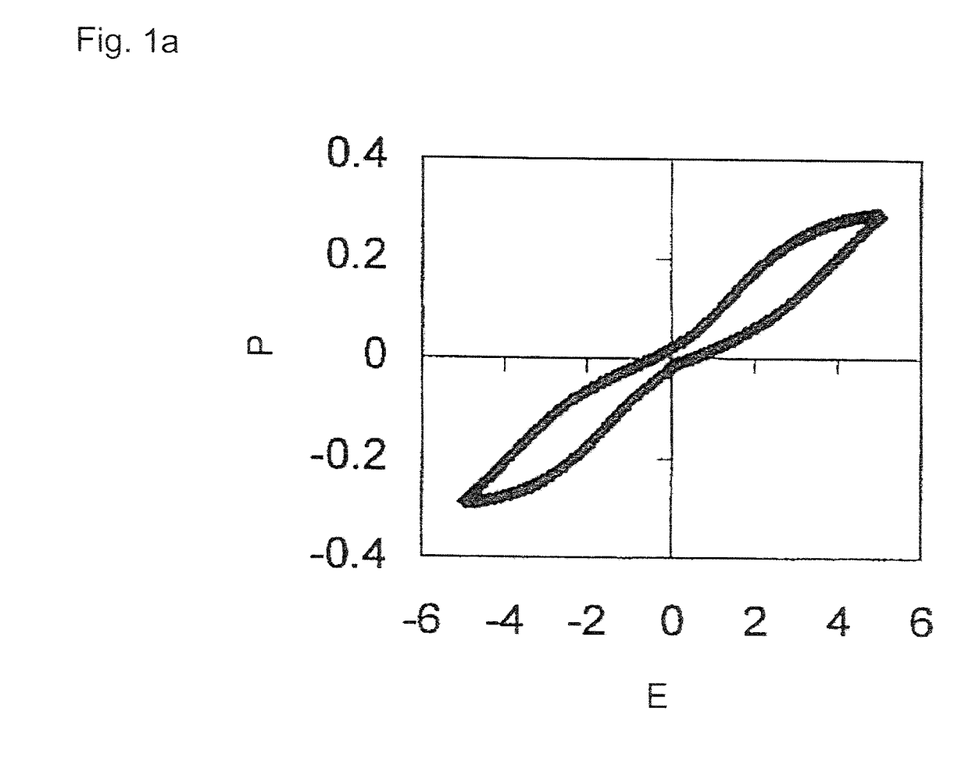
FIG. 1a shows a graphical depiction of the polarization as a function of the electric field of an embodiment of the ceramic material.
Figure 1B:
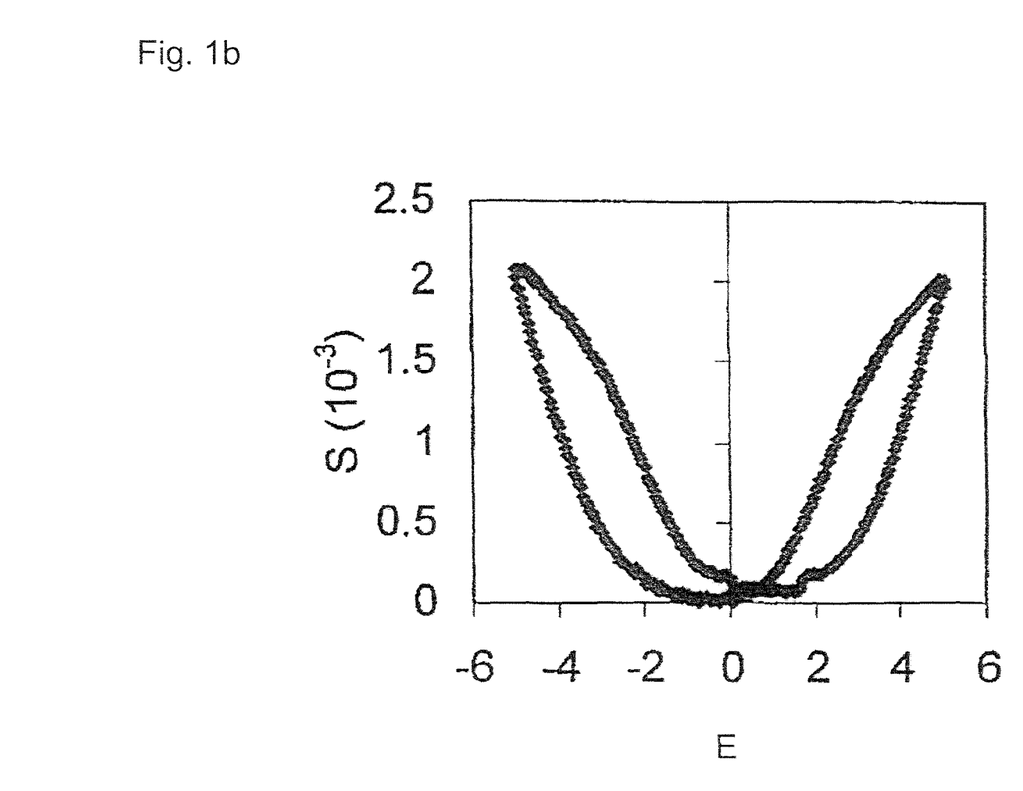
FIG. 1b shows a graphical depiction of the expansion as a function of the electric field of an embodiment of the ceramic material.

FIG. 1a shows a graphical depiction of the polarization P of the ceramic material as a function of the electric field E at room temperature. The y axis is the expansion P in $C/m^2$, and the x axis indicates the electric field E in kV/mm. FIG. 1b shows a graphical depiction of the expansion S, which is plotted against the electric field E in kV/mm.

The expansion S of the ceramic material is 0.2% at a field of 4.7 $kV/mm^2$. The field-induced phase transformation takes place over a wide range, from about 2 kV/mm to 5 kV/mm, which indicates a diffuse phase transformation.

The dielectric loss factor can be calculated from the P-E curve of FIG. 1a and has a value of about 43%. This value is lower than for lead-free ceramics known hitherto. A low dielectric loss factor is necessary in order to achieve a high efficiency in the electromechanical coupling process.

Figure 2A:
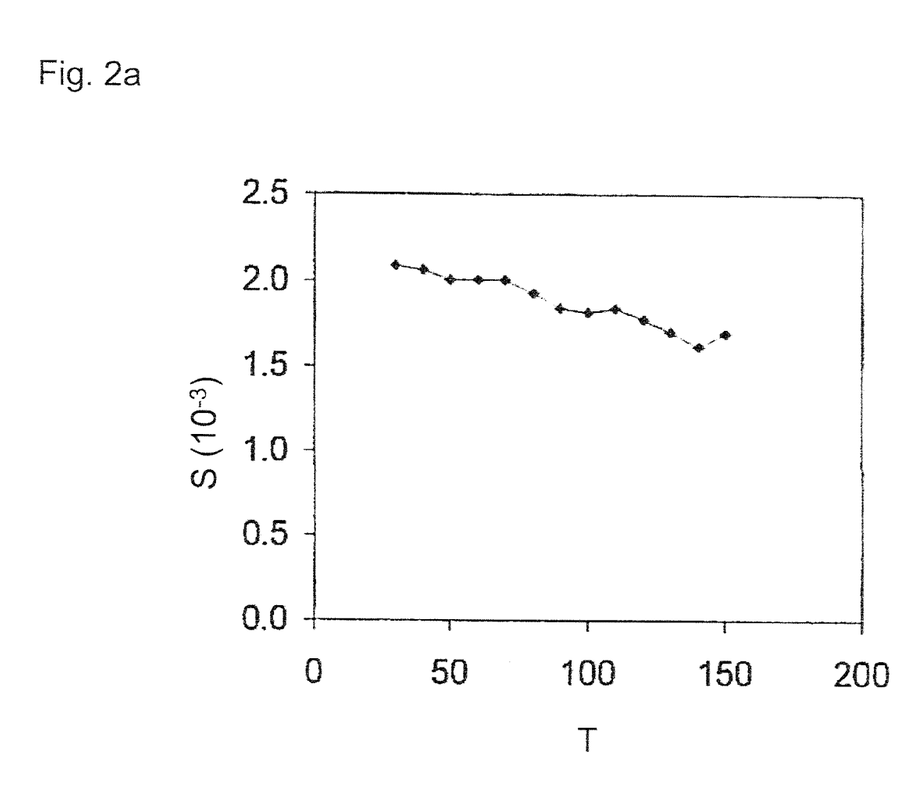
FIG. 2a shows a graphical depiction of the temperature dependence of the expansion of an embodiment of the ceramic material.
Figure 2B:
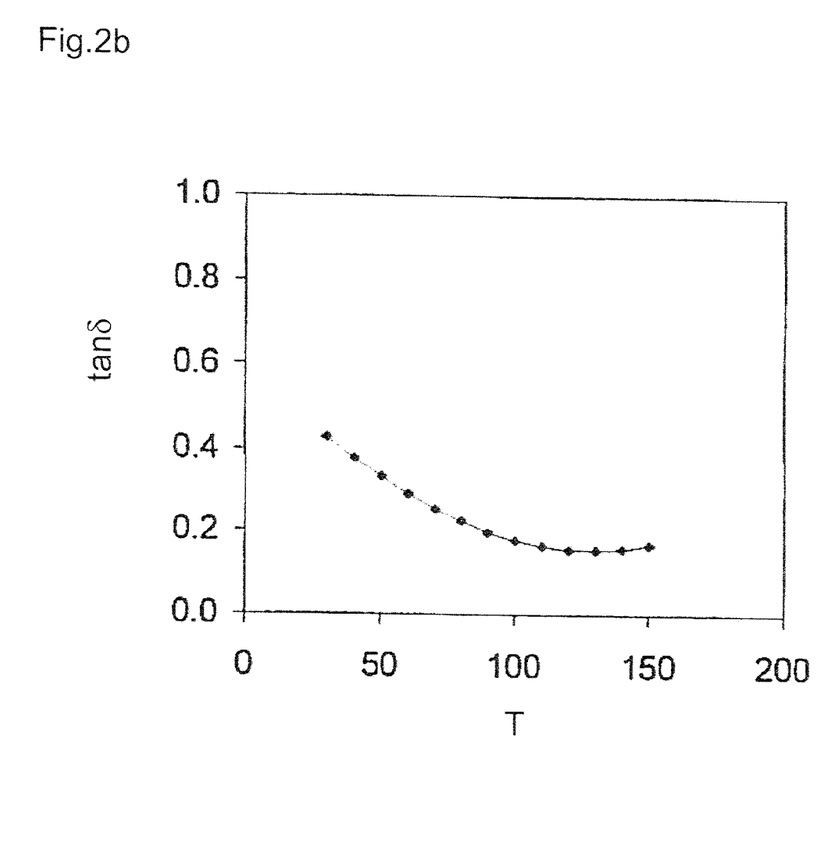
FIG. 2b shows a graphical depiction of the temperature dependence of the dielectric loss factor of an embodiment of the ceramic material.

FIG. 2 shows a graphical depiction of the temperature dependence of the maximum field-induced expansion S and of the dielectric loss factor tan δ. In FIG. 2a, the expansion S in $10^{-3}$ is plotted against the temperature T in ° C., and in FIG. 2b the dielectric loss factor tan δ is plotted against the temperature T in ° C. The field-induced expansion S at 4.7 kV/mm displays a low sensitivity of +/−10% to the temperature in the temperature range from room temperature to 150° C. This is a significant improvement compared to known lead-free ceramics.

At the same time, the dielectric loss factor tan δ has low values even at relatively high temperatures (FIG. 2b). The high temperature stability and the low dielectric loss factor are advantageous properties for use in piezoelectric actuators.

The effects of the individual substituents in the ceramic material and their influence on the characteristic temperatures $T_d$ (depolarization temperature) and $T_c$ (Curie temperature) are demonstrated below.

Figure 3A:
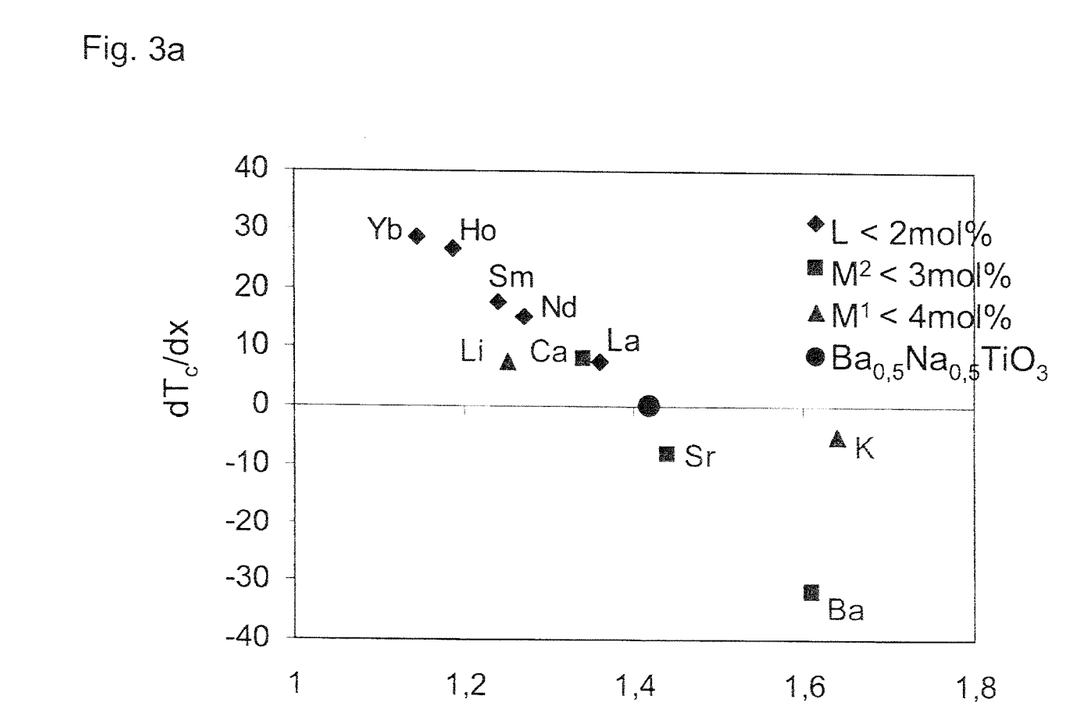
FIG. 3a shows a graphical depiction of the influence of substituents on the Curie temperature of the ceramic material.
Figure 3B:
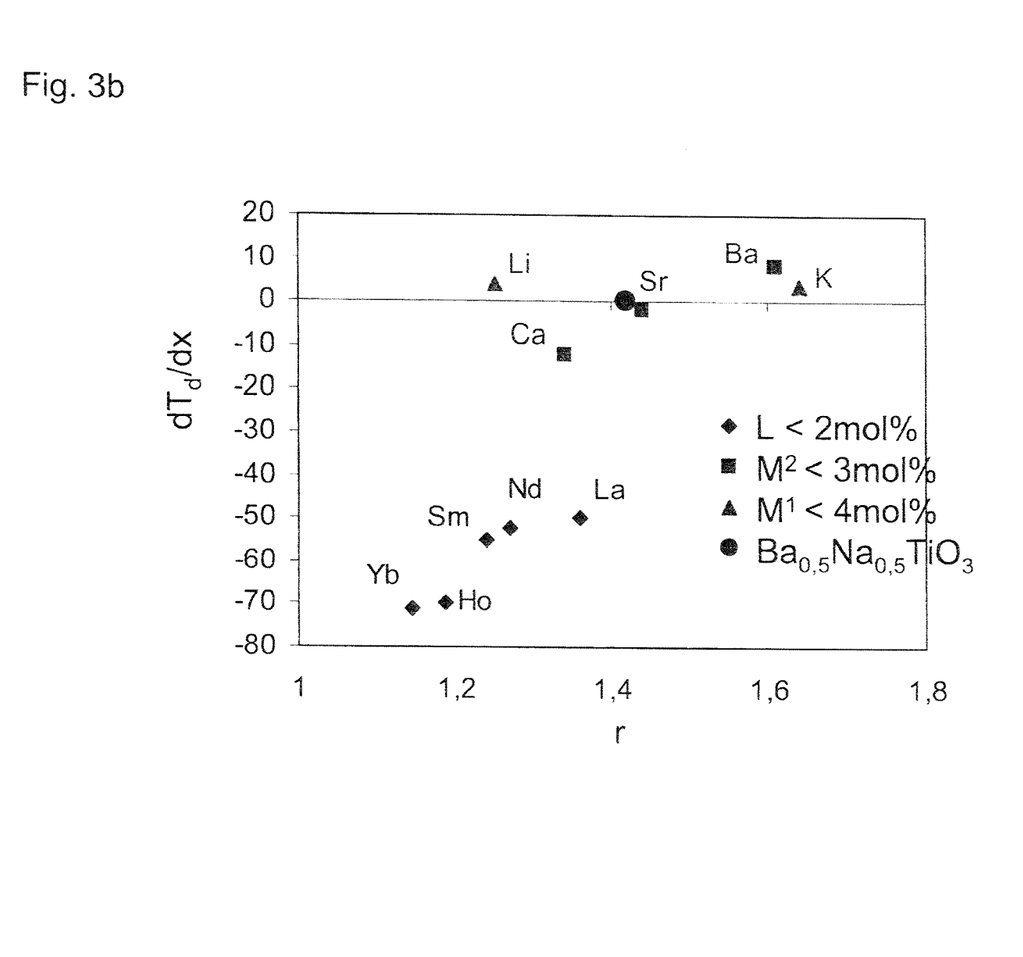
FIG. 3b shows a graphical depiction of the influence of substituents on the depolarization temperature of the ceramic material.

For this purpose, for illustration, the dependence of the depolarization temperature on the content of the substituents $dT_d/dx$ in °C./mol % is plotted against the ion radius r in Å in FIG. 3a and the dependence of the Curie temperature on the content of the substituents $dT_c/dx$ in °C./mol % is plotted against the ion radius r in Å in FIG. 3b. Both temperatures are normalized to the addition of substituents to a $Ba_{0.5}Na_{0.5}TiO_3$ ceramic. The various symbols each represent the type of substituents $M^1$ (alkali metals), $M^2$ (alkaline earth metals) and L (lanthanides). The percentages in the legends of the two figures indicate the limit of the addition of the respective substituents in mol % up to which the relationship between the respective temperature change and the amount of substituent added is linear. The influence of a substituent on the modification of the critical temperatures is thus estimated by means of a linear plot of the dependence of the critical temperatures on the content. Above a critical value of the content, deviations from the linear behavior, saturation or exceeding of the solubility can occur.

The Curie temperature $T_c$ can be strongly influenced by substituents in the A position of the ceramic material. The smaller the ion radius of the substituents, the higher the Curie temperature (FIG. 3a).

The ability of a substituent to change the Curie temperature of a ceramic material also depends on its solubility in the host lattice. For example, the lanthanides have a greater effect but a lower solubility, so that their influence on changing the Curie temperature is limited. Alkali metals dissolve readily in the host lattice but they can no longer change the Curie temperature when their content exceeds 10 mol %.

The depolarization temperature $T_d$ generally becomes lower on addition of substituents having small ion radii (FIG. 3b). The addition of Ba and alkali metals leads to different effects: the addition of Ba, Li and/or K to the $Ba_{0.5}Na_{0.5}TiO_3$ lattice stabilizes the ferroelectric phase as long as their respective content is below a critical value. A higher content of these elements in the lattice leads to a lowering of the depolarization temperature with increasing content due to the increasing randomness in the lattice. For example, the depolarization temperature reaches a maximum at about 3 mol % of Ba and decreases at a higher content of Ba. Furthermore, a peak in the depolarization temperature occurs at about 4 mol % of Li and 8 mol % of K.

In general, the optimization of the content of substituents can be carried out according to the following aspects: the Curie temperature should be above 300° C. and the depolarization temperature should be below 0° C. in order to attain a low temperature dependence of the electromechanical properties. Furthermore, at least one lanthanide should be introduced in order to increase the electrical and steric randomness in the A positions in the lattice so as to avoid energy losses.

The influences of the respective substituents are shown in the following table. Examples of elements which can be present as substituents in the ceramic material are shown in the first column, their ion radii r are shown in the second column, their valence is shown in the third column, the lattice sites which they occupy are shown in the fourth column and their respective influence on the temperatures $T_c$ and $T_d$ are shown in the fifth and sixth columns. An arrow pointing upward means that this substitution increases the respective temperature, while an arrow pointing downward indicates that the substitution lowers the respective temperature, with mixed forms also being possible.

| Element | r [Å] | Valence | Lattice site | Influence on $T_c$ | Influence on $T_d$ |
|---|---|---|---|---|---|
| Na | 1.390 | +1 | — | — | — |
| Bi | 1.450 | +3 | — | — | — |
| Ca | 1.340 | +2 | $Bi_{0.5}Na_{0.5}$ | ↑ | ↓ |
| Sr | 1.440 | +2 | $Bi_{0.5}Na_{0.5}$ | ↓ | ↓ |
| Ba | 1.610 | +2 | $Bi_{0.5}Na_{0.5}$ | ↓ | ↑↓ |
| Yb | 1.144 | +3 | Bi | ↑ | ↓ |
| Ho | 1.187 | +3 | Bi | ↑ | ↓ |
| Nd | 1.270 | +3 | Bi | ↑ | ↓ |
| La | 1.360 | +3 | Bi | ↑ | ↓ |
| Li | 1.252 | +1 | Na | ↑ | ↑↓ |
| K | 1.640 | +1 | Na | ↓ | ↑↓↑ |

The invention is not restricted to the abovementioned examples and embodiments. Rather, combinations of the embodiments are within the scope of the invention even when they are not explicitly mentioned in the claims or in the description.

LIST OF REFERENCE SYMBOLS

P Polarization
E Electric field
S Expansion
tan δ Dielectric loss factor
$T_d$ Depolarization temperature
$T_c$ Curie temperature
r Ion radius

The invention claimed is:

1. A lead-free ceramic material having the general formula $Bi_{0.49}Na_{0.335}K_{0.125}Li_{0.04}Nd_{0.01}TiO_3$.

2. The ceramic material according to claim 1, having a depolarization temperature of <20° C. and a Curie temperature of >150° C.

3. The ceramic material according to claim 1, having a dielectric loss factor of <0.5 in a temperature range from 20° C. to 150° C.

4. The ceramic material according to claim 1, having an expansion in the range from 0.1% to 0.3% on application of an electric field in a temperature range from 20° C. to 150° C.

5. The ceramic material according to claim 1, having a temperature dependence of <30% on application of an electric field in a temperature range from 20° C. to 150° C.

6. A piezoelectric actuator containing a ceramic material according to claim 1.

7. A method for producing a lead-free ceramic material according to claim 1, having the general formula $(Bi_xNa_xM^1_zL_uV_w)(Ti_{1-s}Z_s)O_3$, wherein:
   x+y+z+u+w=1;
   x, y, z, u>0;
   $M^1$ comprises both Li and K;
   L comprises at least one element of the lanthanides;
   V is a vacancy;
   Z is selected from among Zr, Hf and combinations thereof;
   0.005≤z≤0.25;
   0.001≤u≤0.02;
   0≤w≤0.02; and
   0≤s≤0.2, the method comprising:
   A) mixing and milling of powdery starting materials in the stoichiometric ratio;
   B) drying and calcination of the mixture;
   C) milling of the mixture to give a ceramic powder and admixing a binder with the ceramic powder; and D) removing binder from and sintering of the ceramic powder to give the ceramic material, wherein, in process step B), drying is carried out at 60° C. and calcination is carried out at a temperature in the range from 750° C. to 950° C.

8. The method according to the claim 7, wherein the starting materials in process step A) are selected from among oxides and/or carbonates of $M^1$, L and Z.

9. The method for producing a lead-free ceramic material having the general formula $(Bi_xNa_xM^1_zL_uV_w)(Ti_{1-s}Z_s)O_3$ wherein:

x+y+z+u+w=1;
x, y, z, u>0;
$M^1$ comprises both Li and K;
L comprises at least one element of the lanthanides;
V is a vacancy;
Z is selected from among Zr, Hf and combinations thereof;
0.005≤z≤0.25;
0.001≤u≤0.02;
0≤w≤0.02; and
0≤s≤0.2, the method comprising:

A) mixing and milling of powdery starting materials in the stoichiometric ratio;
B) drying and calcination of the mixture;
C) milling of the mixture to give a ceramic powder and admixing a binder with the ceramic powder; and
D) removing binder from and sintering of the ceramic powder to give the ceramic material, wherein, in process step D), binder removal is carried out at 450° C. and sintering is carried out at a temperature in the range from 1000° C. to 1150° C.

10. The method according to claim 9, wherein the starting materials in process step A) are selected from among oxides and/or carbonates of $M^1$, L and Z.

* * * * *